(12) United States Patent
Bauer et al.

(10) Patent No.: US 12,080,454 B2
(45) Date of Patent: Sep. 3, 2024

(54) NICKEL CHROMIUM ALUMINUM THIN FILM RESISTOR

(71) Applicant: Texas Instruments Incorporated, Dallas, TX (US)

(72) Inventors: Gernot Manfred Bauer, Moosburg (DE); Kai-Alexander Schachtschneider, Rohrbach (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/535,872

(22) Filed: Nov. 26, 2021

(65) Prior Publication Data

US 2023/0170111 A1 Jun. 1, 2023

(51) Int. Cl.
*H01C 7/06* (2006.01)
*H01C 7/00* (2006.01)
*H01C 17/00* (2006.01)

(52) U.S. Cl.
CPC ............... *H01C 7/06* (2013.01); *H01C 7/006* (2013.01); *H01C 17/00* (2013.01)

(58) Field of Classification Search
CPC ........... H01C 7/06; H01C 7/006; H01C 17/00
See application file for complete search history.

(56) References Cited

U.S. PATENT DOCUMENTS

| | | | | |
|---|---|---|---|---|
| 5,913,145 A * | 6/1999 | Lu | ............................ | C23C 16/08 438/653 |
| 7,410,879 B1 * | 8/2008 | Hill | ........................ | H01L 28/24 438/384 |
| 8,659,085 B2 * | 2/2014 | Ng | ........................ | H01L 28/20 257/359 |
| 2005/0122207 A1 * | 6/2005 | Vialpando | ............ | H01C 17/075 257/E21.004 |
| 2006/0228879 A1 | 10/2006 | Beach et al. | | |
| 2010/0136764 A1 * | 6/2010 | Dirnecker | ......... | H01L 21/76838 257/E21.004 |
| 2018/0019297 A1 * | 1/2018 | Dirnecker | ............... | H01L 28/24 |
| 2018/0261664 A1 * | 9/2018 | Dirnecker | ........... | H01L 21/0273 |

FOREIGN PATENT DOCUMENTS

DE 102008060077 A1 6/2010
JP H10195646 A * 7/1998

OTHER PUBLICATIONS

JPH10195646, Fujikawa et al., machine translation. (Year: 1998).*
Weuzhu Li, et al., "Improving the Wet Chemical Patterning of Nichrome Film by Inserting an Ultrathin Titanium Layer", State Key Lab of Electronic Thin Films and Integrated Devices, School of Optoelectronic Information, University of Electronic Science and Technology of China, Chengdu 610054, P. R. China.
T93041DE01 Office Action dated Sep. 13, 2023.

* cited by examiner

*Primary Examiner* — Kyung S Lee
(74) *Attorney, Agent, or Firm* — Yudong Kim; Frank D. Cimino

(57) ABSTRACT

An integrated circuit includes a thin film resistor body that is formed over a dielectric layer. An interfacial layer is formed on the thin film resistor body and resistor heads are formed on the interfacial layer. The thin film resistor body includes nickel chromium aluminum (NiCrAl) and the resistor heads include titanium tungsten (TiW).

35 Claims, 10 Drawing Sheets

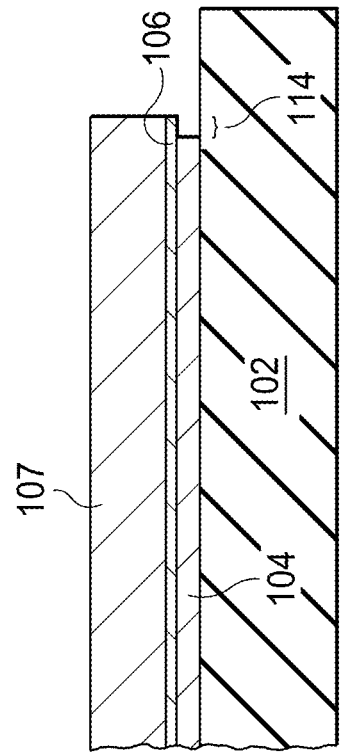
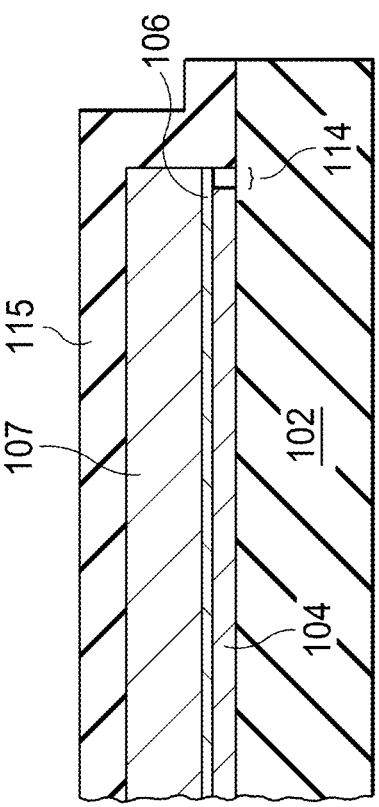
FIG. 1C
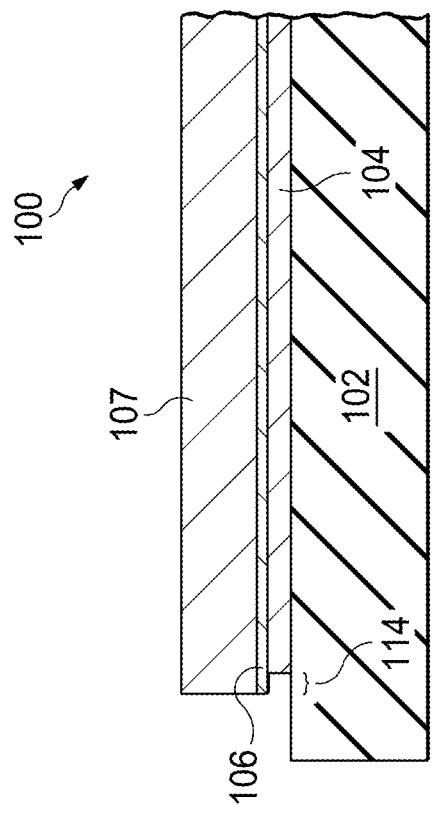
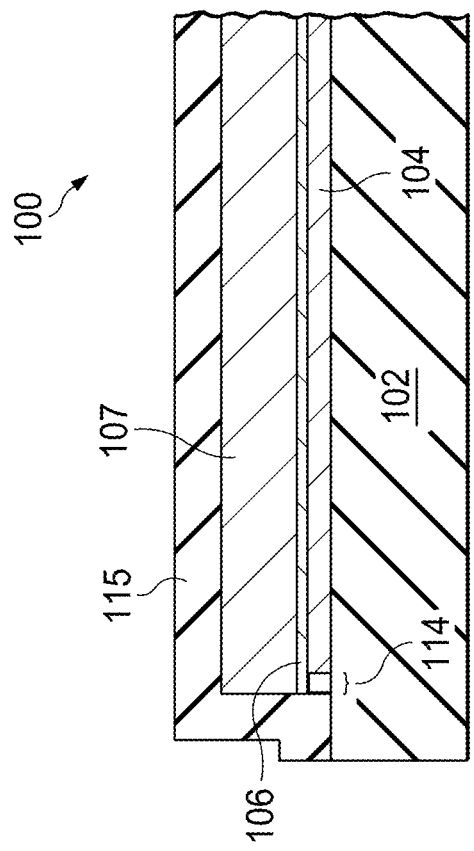
FIG. 1D

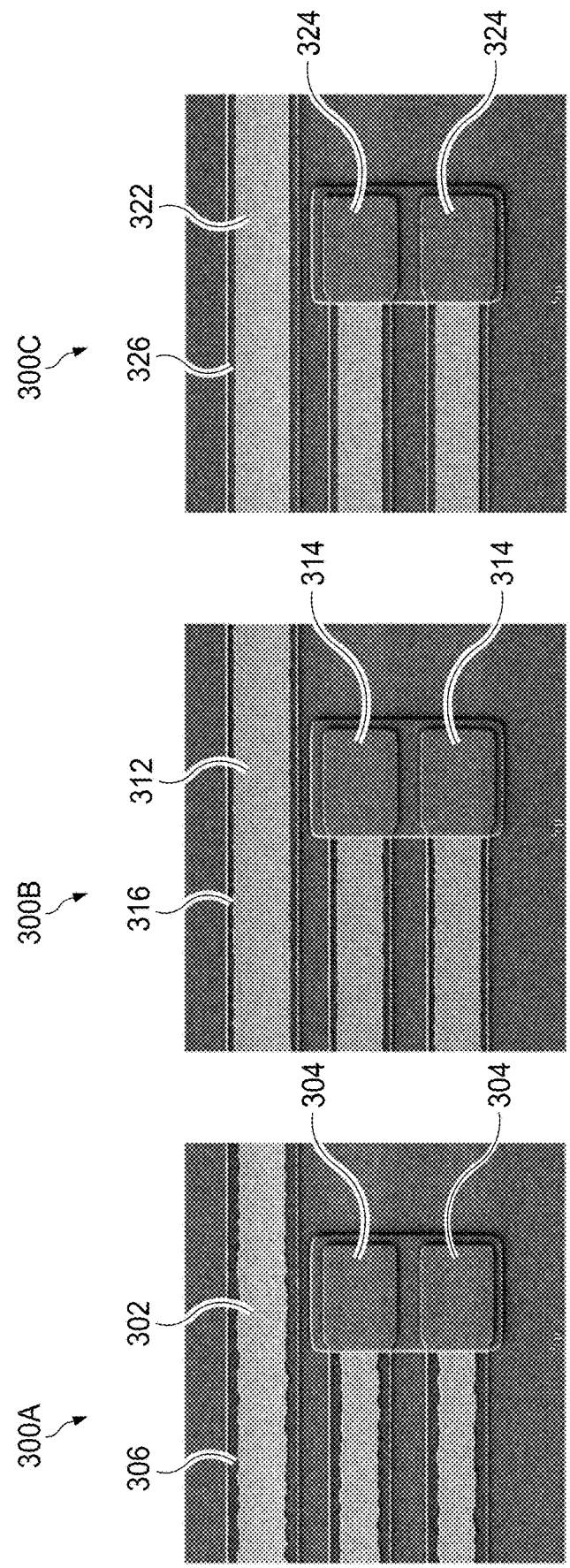

NICKEL CHROMIUM ALUMINUM THIN FILM RESISTOR

BACKGROUND

Thin film resistors (TFRs) containing nickel chromium aluminum (NiCrAl) may utilize a hardmask deposited and patterned over the TFR, followed by a wet etch to structure the NiCrAl film. The hardmask may be formed of a material that will be reused as resistor heads where contacts will land and may, for example, be titanium tungsten (TiW). This wet etch may produce an undercut of the NiCrAl resistor beneath the hardmask and may also produce significant line-edge roughness (LER). Additional problems may include non-uniformity across the wafer and/or an undesirably high temperature coefficient of resistance (TCR). Improvements are needed.

SUMMARY

Disclosed implementations provide an improved TFR by adding a thin layer to improve the bonding between the NiCrAl resistor body and the TiW head material. Addition of the new layer may reduce the undercut; this interfacial layer may also reduce the line-edge roughness and improve the uniformity across the wafer. Some implementations may also provide a lower temperature coefficient of resistance.

In one aspect, an implementation of an integrated circuit is disclosed. The integrated circuit includes a thin film resistor body of nickel chromium aluminum (NiCrAl) formed over a dielectric layer. An interfacial layer is formed on the thin film resistor body and resistor heads are formed on the interfacial layer. The resistor heads including titanium tungsten (TiW).

In another aspect, an implementation of a method of fabricating an integrated circuit is disclosed. The method includes forming a thin film layer on a dielectric layer, the thin film layer including nickel chromium aluminum, and continues with forming an interfacial layer directly on the thin film layer. The method then forms a resistor-head layer on the interfacial layer, with the resistor-head layer including titanium tungsten. The method patterns and etches the resistor-head layer to form a resistor hardmask for the thin film layer and etches the thin film layer using the resistor hardmask and a wet etch to form a thin film resistor body.

In yet another aspect, an implementation of a thin film resistor structure is disclosed. The thin film resistor structure includes a thin film resistor body containing nickel chromium aluminum formed over an oxide layer, the thin film resistor body having a thickness less than or equal to about 0.1 μm and a titanium nitride layer formed over the thin film resistor body. Resistor heads that include titanium tungsten are formed on the TiN layer.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

FIGS. 1A-1E depict stages in the fabrication of a thin film resistor according to an implementation of the disclosure;

FIG. 3A shows an SEM photograph of sections of a thin film resistor fabricated according to a baseline implementation;

FIG. 3B shows an SEM photograph of sections of a thin film resistor fabricated using Ti as a thin interfacial layer according to an implementation of the disclosure;

FIG. 3C shows an SEM photograph of sections of a thin film resistor fabricated using TiN as a thin interfacial layer according to an implementation of the disclosure;

DETAILED DESCRIPTION

Specific implementations will now be described in detail with reference to the accompanying figures. In the following detailed description of implementations, numerous specific details are set forth in order to provide a more thorough understanding of the disclosure. However, it will be apparent to one of ordinary skill in the art that other implementations may be practiced without these specific details. In other instances, well-known features have not been described in detail to avoid unnecessarily complicating the description.

While resistors may be fabricated in silicon/polysilicon or as thick film resistors that are formed from a metallic paste, thin film resistors may be advantageously used for applications in which a higher precision is required, e.g., monitoring equipment within the medical and aerospace sectors, audio applications, computer chips, power supply converters, etc. The use of NiCrAl to form the body of a thin film resistor presents problems due to the need for a wet etch.

Figure 6:
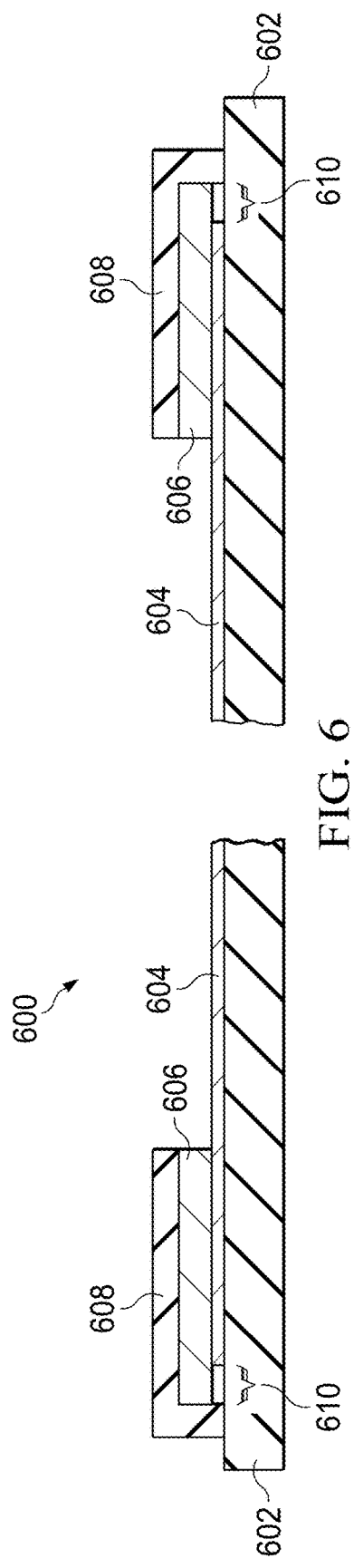
FIG. 6 depicts a thin film resistor according to a baseline implementation.

FIG. 6 depicts a lengthwise cross-section of a TFR structure 600 formed according to a baseline implementation. The TFR structure 600 lies on a dielectric layer 602, which may be an oxide layer 602; a thin film resistor body 604 has been formed on the dielectric layer 602. Resistor heads 606 have been formed at both ends of the thin film resistor body 604 in order to provide a landing pad for contacts. The thin film resistor body 604 may contain NiCrAl and the resistor heads 606 may contain TiW. An oxide hardmask 608, which was previously used to pattern the TiW to form the resistor heads 606, has been left over the resistor heads 606, because there is no need to remove the oxide hardmask prior to depositing an inter-level dielectric.

The process of fabricating the TFR structure 600 may follow a flow that includes deposition of a NiCrAl resistor body layer, a TiW resistor head layer, and a NiCr photoresist mask layer. The NiCr photoresist mask layer is patterned to protect the areas where the thin film resistor layer is desired and to expose remaining regions. The TiW layer may first be dry etched through the NiCr photoresist mask layer and then used as a hardmask during the wet etch of the NiCrAl resistor body layer to form the thin film resistor body 604. The fabrication process may continue with deposition of an oxide hardmask, which may then be patterned and used to protect the region for the resistor heads 606 while remaining portions of the TiW layer are dry etched from regions between the resistor heads 606.

During the wet etch of the resistor body layer, the fabrication process creates an undercut 610 of the thin film resistor body 604 that reduces the size of the thin film resistor body 604; this undercut must be taken into account when the reticle is created for the thin film resistor body 604. In one implementation of the baseline TFR structure 600, the undercut was 0.55 µm. Such an undercut is especially problematic in smaller resistors, which in one implementation may have a width of 2 µm and a length of 50 µm. In this example implementation, an undercut of 0.55 µm causes not only a significant loss of area, but also adds significant line-edge roughness (LER). The baseline thin film resistors also had high non-uniformity within the wafer and a high temperature coefficient of resistance, which reflects the change in resistance as the temperature of the integrated circuit changes.

The present inventors realized that the undercut produced during the wet etch was being exacerbated by a bond between the resistor layer and the resistor head layer that was not strong enough to prevent excess etching at the layer junction. A solution was found by adding a new interfacial layer between the resistor layer and the resistor head layer in which the interfacial layer provides bonding to both the underlying resistor layer containing NiCrAl and the overlying resistor head layer containing TiW. The new interfacial layer may include a very thin layer of TiN, Ti, or a Ti/TiN multilayer. Alternatively, the new interfacial layer may be the result of applying an $N_2$-containing plasma step to the NiCrAl surface. The new interfacial layer is able to suppress accelerated lateral etch into the resistor layer.

Figure 1A:
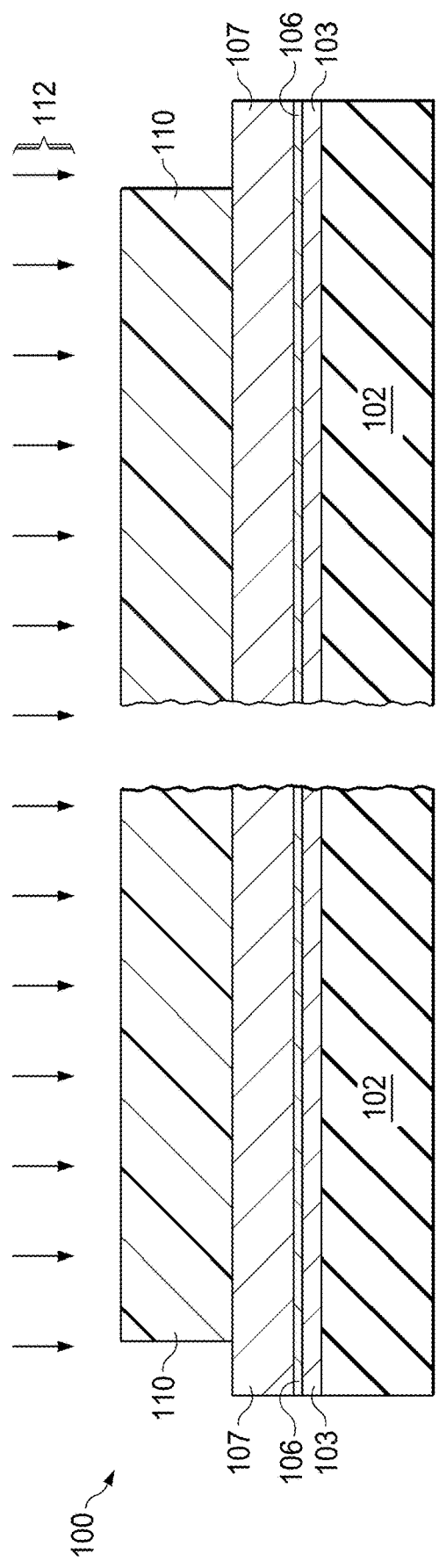

FIGS. 1A-1E depict stages in the fabrication of a thin film resistor structure 100 according to an implementation of the disclosure. FIG. 1A depicts the thin film resistor structure 100 at an early stage in the fabrication. A dielectric layer 102, which in the implementation shown may be an oxide layer, has been provided. A thin film layer 103 has been deposited on the dielectric layer 102; a thin interfacial layer 106 has been formed at the surface of the thin film layer 103; and a resistor head layer 107 has been deposited on the thin interfacial layer 106. In one implementation, the thin film layer 103 may be NiCrAl having a thickness that is less than about 0.1 µm and the resistor head layer 107 may be TiW. The thin interfacial layer 106 may be Ti, TiN, or a combination of these materials in a multilayer structure. Alternatively, the new interfacial layer 106 may be the result of applying an $N_2$-containing plasma step to the NiCrAl surface. In one implementation, the thin interfacial layer 106 may have a thickness in the range of about 3 Å to about 20 Å thick. In one implementation, the thin interfacial layer 106 may also have a greater thickness, e.g. in the range of about 20 Å to about 100 Å. In the context of thickness, the term "about" means±10%. As seen in FIG. 1A, a first photoresist layer 110 has been deposited and patterned to protect the region where a thin film resistor is desired. A dry etch 112 is being performed that will etch away exposed portions of the resistor head layer 107.

Figure 1B:
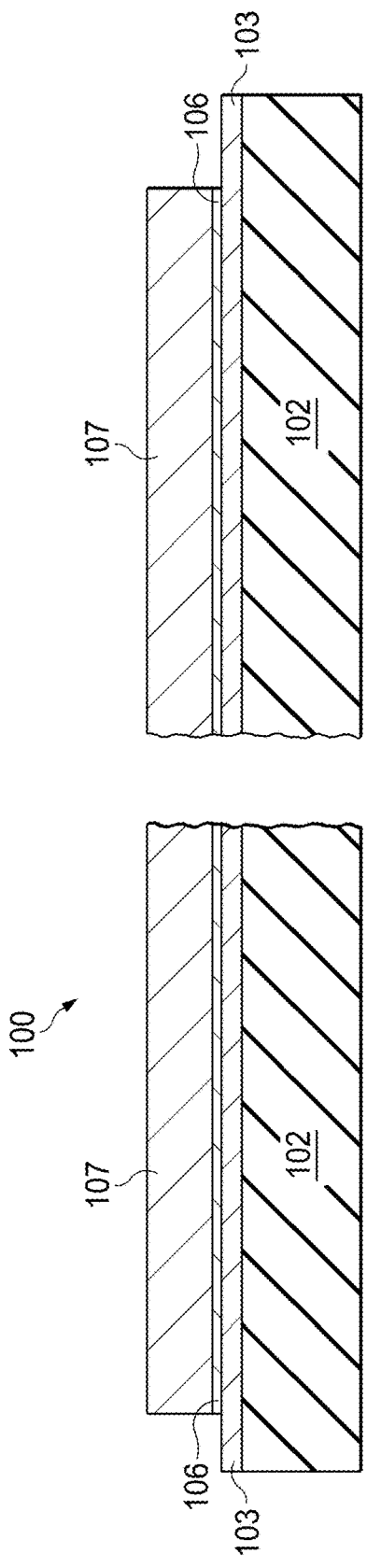

FIG. 1B depicts the thin film resistor structure 100 after the dry etch of the resistor head layer 107 of FIG. 1A has shaped the resistor head layer 107 to act as a resistor hardmask for etching the thin film layer 103 and after the first photoresist layer 110 has been removed. The thin interfacial layer 106 has also been etched. The thin film layer 103 needs to be etched using a wet etch and the new thin interfacial layer 106 may improve bonding between the thin film layer 103 and the resistor head layer 107 that may decrease the lateral undercut created. The added interfacial layer may also improve uniformity within the wafer and/or the uniformity across wafers.

FIG. 1C depicts the thin film resistor structure 100 after the wet etch of the thin film layer 103 to form the thin film resistor body 104. An undercut 114 is still present in the thin film resistor body 104 below the resistor head layer 107, but the undercut 114 may be much smaller than previously achieved. In one implementation using TiN, the undercut may be as small as about 0.39 µm instead of the previous value of 0.55 µm. In one implementation using Ti, the undercut may be as small as about 0.15 µm.

Figure 1E:
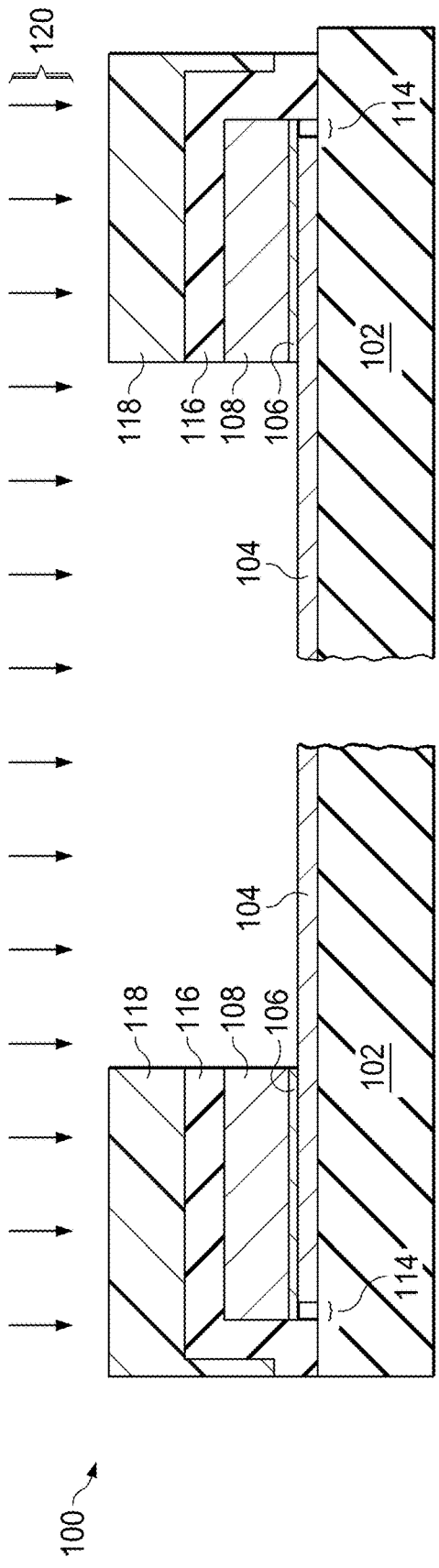

FIG. 1D depicts the thin film resistor structure 100 after a hardmask layer 115, which in one implementation includes an oxide, has been deposited on the thin film resistor structure 100. FIG. 1E depicts the thin film resistor structure 100 after a second photoresist layer 118 has been deposited and patterned, and an etch process 120 has etched through the hardmask layer 115 to form a resistor-head hardmask 116 and also through the resistor head layer 107 to form resistor heads 108. The etch process 120 also etches through the thin interfacial layer 106. At the conclusion of the etch process 120, the second photoresist layer 118 may be removed. The resistor-head hardmask 116 may be removed or may be left in place, because following stages in the fabrication generally include the fabrication of a dielectric layer over the thin film resistor structure 100.

Figure 1F:
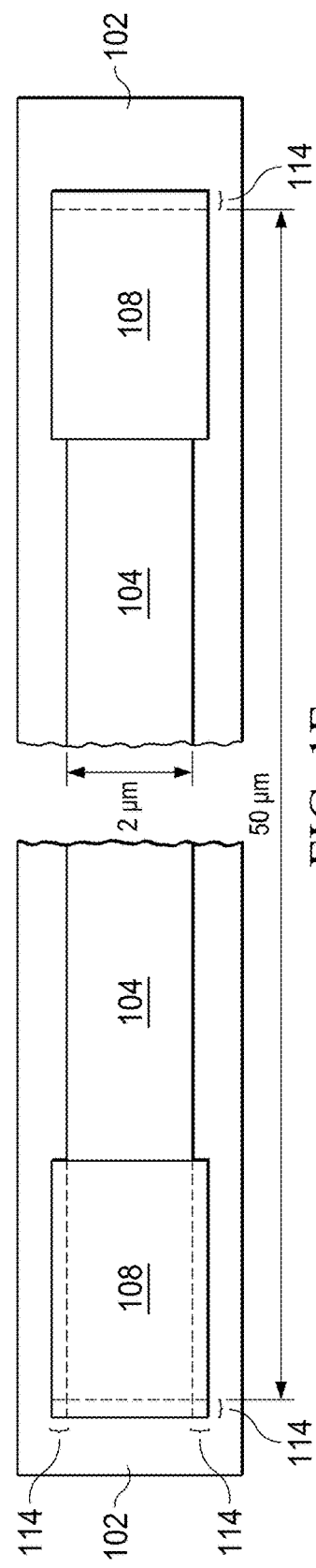
FIG. 1F depicts a plan view of the thin film resistor of FIG. 1E without the oxide mask.

FIG. 1F depicts a plan view of the thin film resistor structure 100 of FIG. 1E without the resistor-head hardmask 116. In the example implementation shown, the thin film resistor body 104 has a width of about 2 µm and a length of about 50 µm. In the context of length and width, the term "about" means±10%. The width lost to the wet etch process is demonstrated by the undercut 114, which extends on three sides of the resistor heads 108 and also continues down the length of the thin film resistor body 104.

Figure 2:
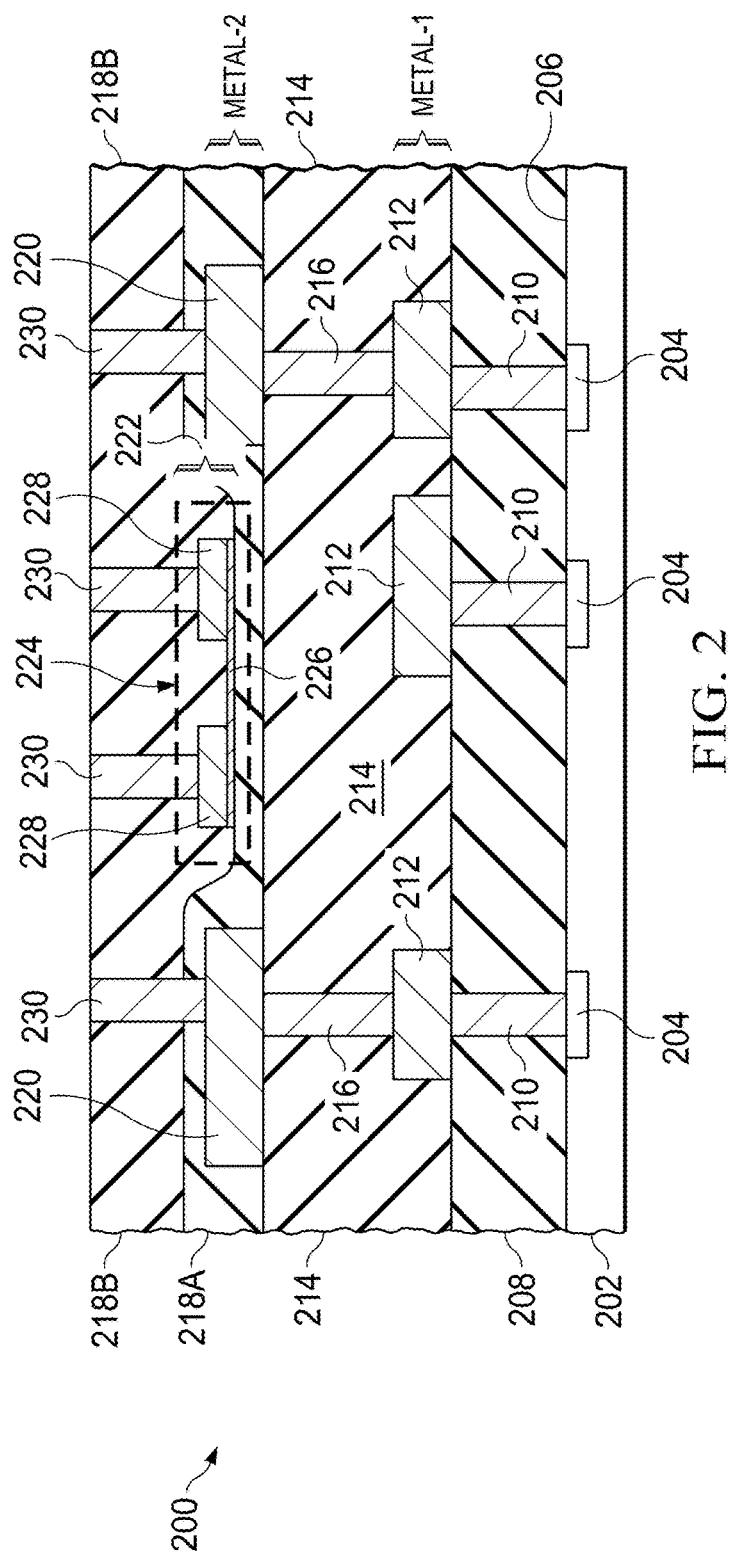
FIG. 2 depicts a cross-section of an integrated circuit in which the thin film resistor of FIG. 1E may be implemented.

FIG. 2 depicts a cross-section of an integrated circuit 200 in which the thin film resistor may be fabricated. In this implementation, a substrate 202 may include bulk silicon, an epitaxial layer, a semiconductor on insulator (SOI) substrate, or another substrate, whether currently known or future developed. A number of functional devices 204 have been formed at a surface 206 of the substrate. The functional devices 204 may include transistors, resistors, storage elements, etc., that may be conductively coupled to other functional devices 204 or to external inputs/outputs through vias and a number of metallization layers formed over the substrate. Although the surface 206 of the substrate 202, including the functional devices 204, is shown as planar, one skilled in the art will recognize that certain elements, e.g., gate structures, may extend above the surface 206 of the substrate 202.

In the implementation of the integrated circuit 200 shown, a first dielectric layer 208 lies over the substrate 202 and the functional devices 204 and forms a pre-metal dielectric layer. The first dielectric layer 208 contains contacts 210, which extend to contact the functional devices 204. A second dielectric layer 214, which may also be referred to as a first inter-level dielectric, lies on the first dielectric layer 208 and contains first metal segments 212, which are part of a first metallization layer, and first vias 216, which may be conductively coupled to at least some of the first metal segments 212. What would normally be a third dielectric layer or second inter-level dielectric layer has been separated into a first dielectric sub-layer 218A and a second dielectric sub-layer 218B in order to integrate the fabrication of a thin film resistor structure into the metallization layers. The first dielectric sub-layer 218A contains and covers second metal segments 220, which are part of the second metallization layer. A trench 222 can be seen in the first dielectric sub-layer 218A, which allows room for the fabrication of a thin film resistor structure 224. The thin film resistor structure 224, which may be fabricated according to the sequence shown in FIGS. 1A-1E, contains a thin film resistor body 226 and resistor heads 228. The second dielectric sub-layer 218B lies on the first dielectric sub-layer 218A and covers the thin film resistor structure 224. Several second vias 230 extend through the second dielectric sub-layer 218B to contact the resistor heads 228, while others of the second vias 230 may extend into the first dielectric sub-layer 218A to contact respective ones of the second metal segments 220. Although this example integrated circuit 200 discloses the thin film resistor structure 224 at the level of the second metallization layer, the thin film resistor structure 224 may be formed at any metallization layer.

FIGS. 3A-3C show scanning electron microscope (SEM) photographs of three thin film resistor structures implemented with a NiCrAl resistor body and TiW resistor heads, either using the baseline process or using a thin interfacial layer. Each of these SEM photographs was taken on a chip near the center of the wafer. In each SEM photograph, a central section of the thin film resistor is shown in the upper third of the photograph and end sections containing the resistor heads are shown in the lower two thirds of the photographs. FIG. 3A shows a thin film resistor structure 300A that was fabricated using the baseline process. The thin film resistor structure 300A includes a thin film resistor body 302 and resistor heads 304. The darker area 306 seen both above and below the thin film resistor body 302 and outlined in white highlights the width of the thin film resistor body 302 as defined by the reticle and demonstrates the area lost due to the undercut. The wet etch process used to remove excess portions of the NiCrAl layer not only removed portions of the thin film resistor body 302 that lay under the TiW layer at the time of the etch process, but also left a very rough edge on the thin film resistor body 302. As noted above, the thin film resistor body 302 was located on a chip near the wafer center; instances of the thin film resistor body 302 taken from near the edges of the wafer displayed improved edges and less undercut, but the lack of uniformity across the wafer causes a large amount of wastage.

FIG. 3B shows a thin film resistor structure 300B that was fabricated using the disclosed process, with Ti as a thin interfacial layer. The thin film resistor structure 300B includes a thin film resistor body 312 and resistor heads 314, with darker areas 316 seen both above and below the thin film resistor body 312 highlighting the width of the thin film resistor body 312 as defined by the reticle. The same wet etch process was used in fabricating the thin film resistor body 312 as was used in the baseline process, however, use of the thin interfacial layer containing Ti both reduced the undercut significantly and also provided much smoother edges on the thin film resistor body 312.

FIG. 3C shows a thin film resistor structure 300C that was fabricated using the disclosed process, with TiN as a thin interfacial layer. The thin film resistor structure 300C includes a thin film resistor body 322 and resistor heads 324, with darker areas 326 above and below the thin film resistor body 322 again highlighting the width of the thin film resistor body 322 as defined by the reticle. The same wet etch process was again used in fabricating the thin film resistor body 322, with the result being that the thin interfacial layer containing TiN also reduced the undercut significantly from the undercut seen in FIG. 3A, although not as much as the use of Ti as the thin interfacial layer. However, the use of TiN provided the smoothest edges on the thin film resistor body 322 of any of the three processes.

Figure 4A:
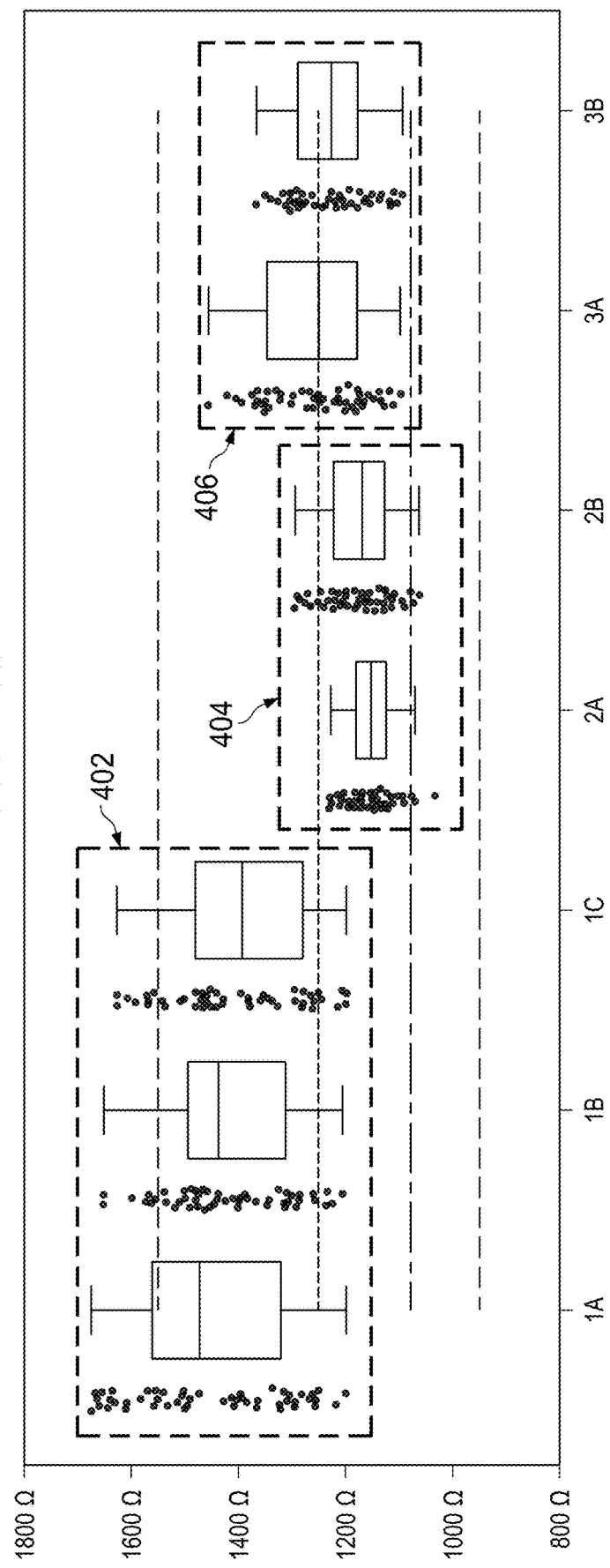
FIGS. 4A-4D depict results of several tests on both the baseline implementation and two new implementations of the thin film resistor of FIG. 1E.

FIGS. 4A-4D each compares test results on wafers formed consistent with the described baseline process with wafers formed consistent with the addition of a thin interfacial layer containing either Ti or TiN. Unless otherwise noted, the thin film resistor tested had a width of about 2 μm and a length of about 50 μm. FIG. 4A compares the resistance, in ohms, of the three groups of wafer; the resistors were obtained from a scribeline monitoring chip, which contained 53 sites per wafer. A test wafer 1A, a test wafer 1B, and a test wafer 1C belong to a baseline wafer group 402 formed consistent with the baseline process; a test wafer 2A and a test wafer 2B belong to a Ti wafer group 404 formed consistent with the disclosed process using Ti for the interfacial layer; and a test wafer 3A and a test wafer 3B belong to a TiN wafer group 406 formed consistent with the disclosed process using TiN for the interfacial layer. The baseline wafer group 402 demonstrated the widest variation in resistance across the wafer, as well as the highest values, while the Ti wafer group 404 demonstrated the least variation across the wafer and the lowest values. The TiN wafer group 406 demonstrated results that are intermediate between the other two wafer groups, having values that generally ranged higher and had greater variation than the Ti wafer group 404, but generally lower values and less variation than the baseline wafer group 402.

Figure 4B:
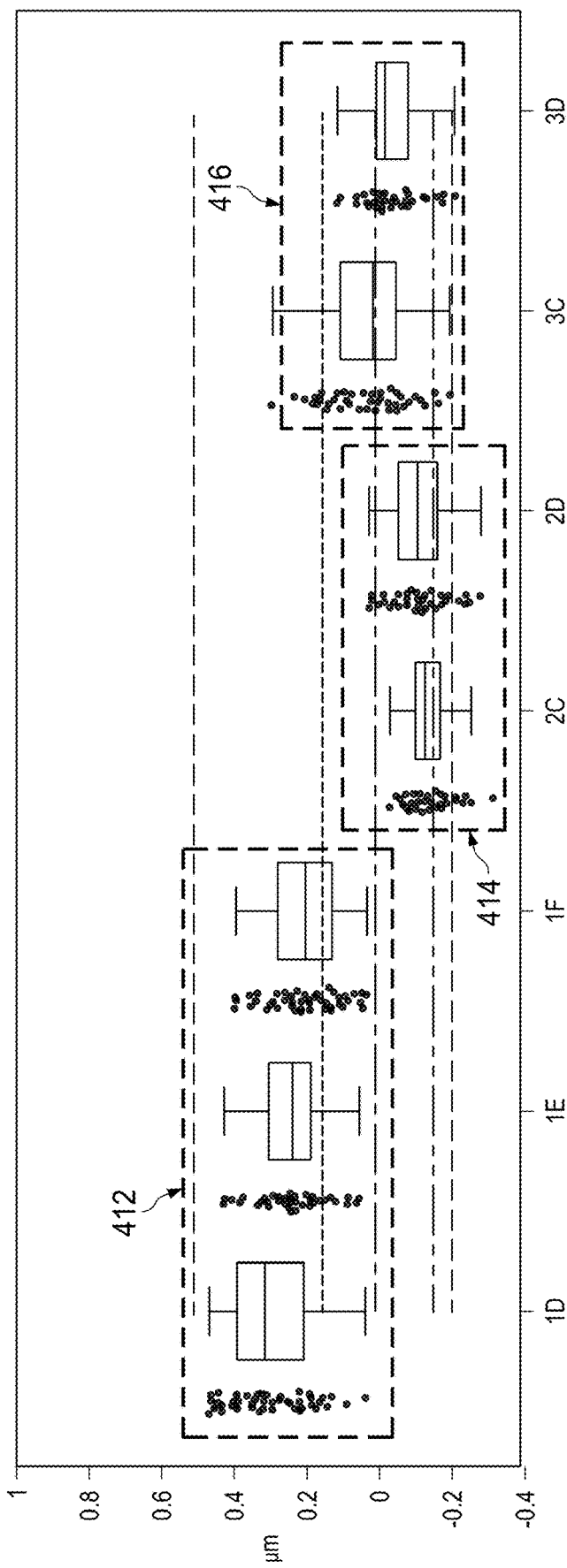

FIG. 4B compares the width reduction in microns on the three groups of wafer, which were also taken from a scribeline monitoring chip. The values are calculated from multiple resistors to reflect the loss in the width of the thin film resistor with the etch process. The negative values are a result of the limits of measurements and the calculations and are not real, but do provide a means to compare different methodologies. Test wafers 1D, 1E, 1F all belong to a baseline wafer group 412 formed consistent with the baseline process; test wafers 2C, 2D belong to a Ti wafer group 414 formed consistent with the disclosed process using Ti for the interfacial layer; and test wafers 3C, 3D belong to a TiN wafer group 416 formed consistent with the disclosed process using TiN for the interfacial layer. The results demonstrate what was seen visually in FIGS. 3A-3C and graphically in FIG. 4A, e.g., that the baseline wafer group 412 demonstrated the greatest width reduction and greatest variation across the wafers; the Ti wafer group 414 showed the lowest width reduction and the least variation across the wafer; and the TiN wafer group 416 demonstrated results that were improved over the baseline wafer group 412 but not as much as was shown in the Ti wafer group 414.

Figure 4C:
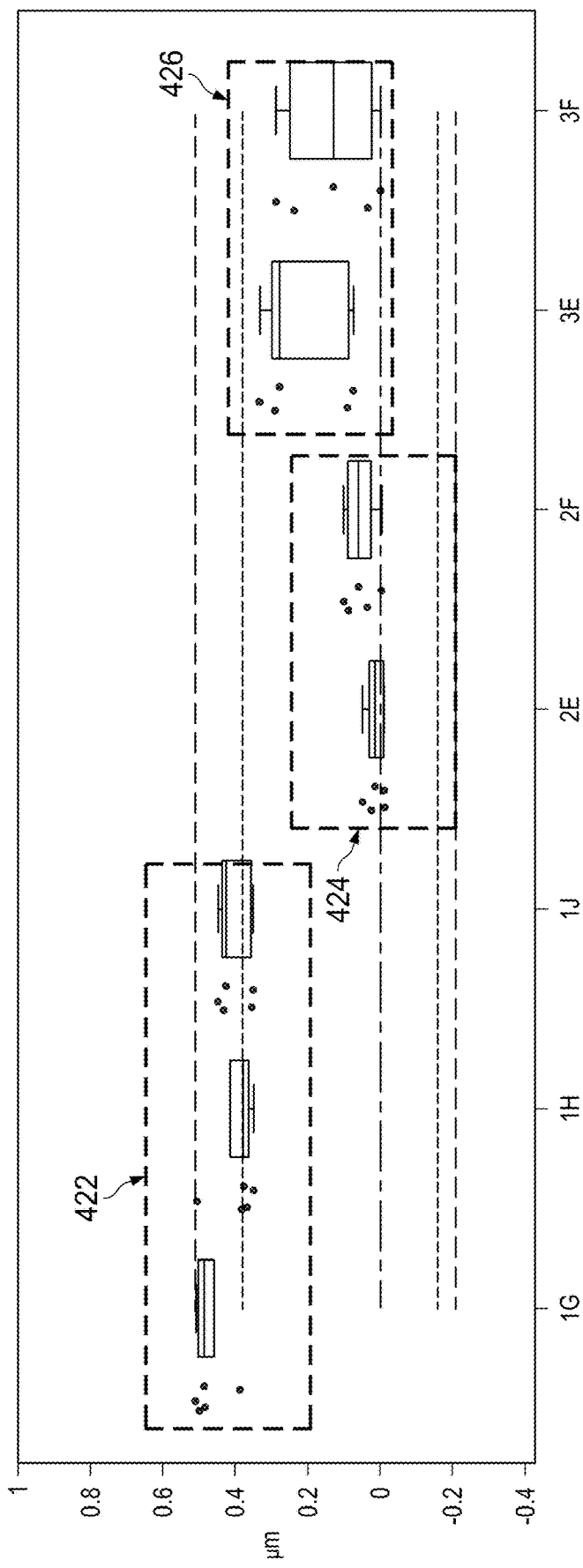

FIG. 4C also compares width reduction across the three wafer groups, but shows results from a process monitoring chip, which contains only five sites on the wafers. The values shown are calculated using data from two different resistors, both having a length of 100 µm; a first resistor has a width of 10 µm and a second resistor has a width of 5 µm. Test wafers 1G, 1H, 1J belong to a baseline wafer group 422 formed consistent with the baseline process; test wafers 2E, 2F belong to a Ti wafer group 424 formed consistent with the disclosed process using Ti for the interfacial layer; and test wafers 3E, 3F belong to a TiN wafer group 426 formed consistent with the disclosed process using TiN for the interfacial layer. The results shown in FIG. 4C are generally consistent with the results demonstrated in FIG. 4B, with the exception of the TiN wafer group 426, which showed the greatest variation across the wafers, more than either of the baseline wafer group 422 and the Ti wafer group 424, although the values were lower than the baseline wafer group 422. While the specific results may be dependent on the etchant and etch conditions used, it is anticipated that the improvement in the undercut would also extend across multiple etchants and conditions.

Figure 4D:
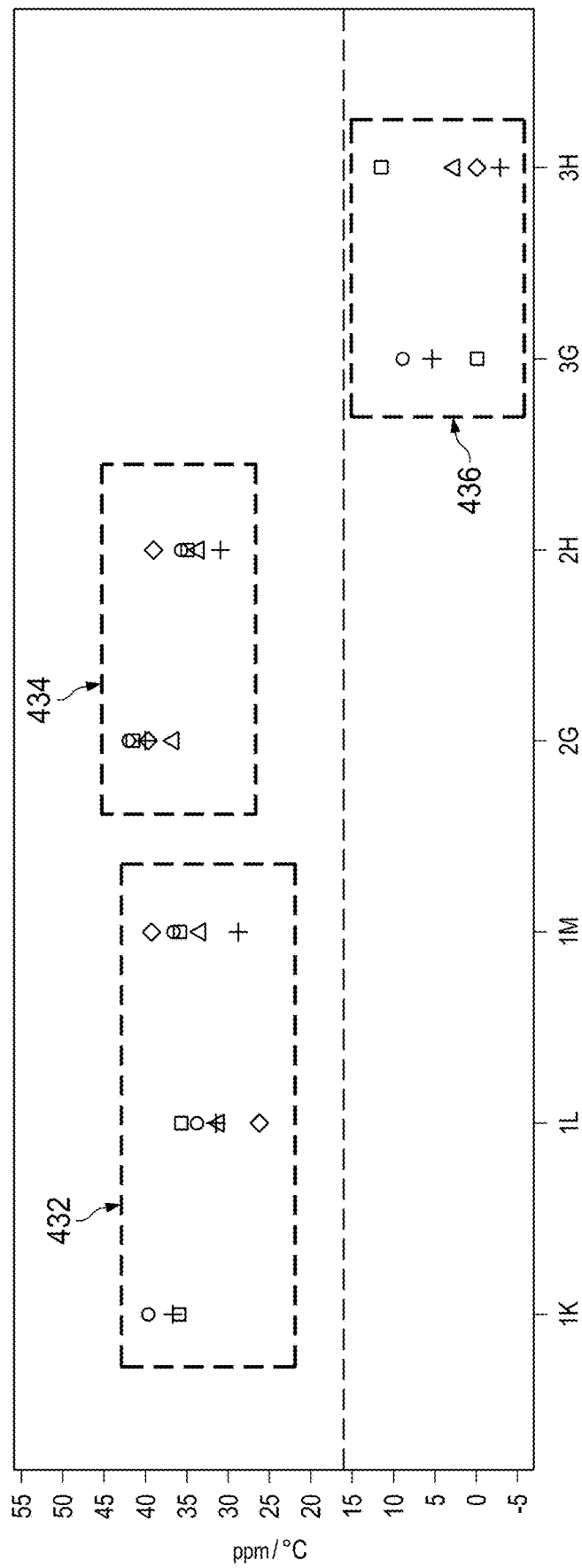

FIG. 4D compares results for determinations of a temperature coefficient of resistance, which measures the change in resistance as the temperature of the resistor varies. This test was performed using process monitoring chips containing five sites per wafers; in the test, each resistor is measured at 30° C. and at 100° C. and the value is extracted A baseline wafer group 432, formed consistent with the baseline process, includes test wafers 1K, 1L, 1M; a Ti wafer group 434 formed consistent with the disclosed process using Ti for the interfacial layer includes test wafers 2G, 2H; and a TiN wafer group 436 formed consistent with the disclosed process using TiN for the interfacial layer includes test wafers 3G, 3H. Both the baseline wafer group 432 and the Ti wafer group 434 demonstrate similar, undesirably high values of the temperature coefficient of resistance. In this test, the TiN wafer group 436 demonstrated a clear advantage, with all values falling under 15 ppm/° C.

Figure 5:
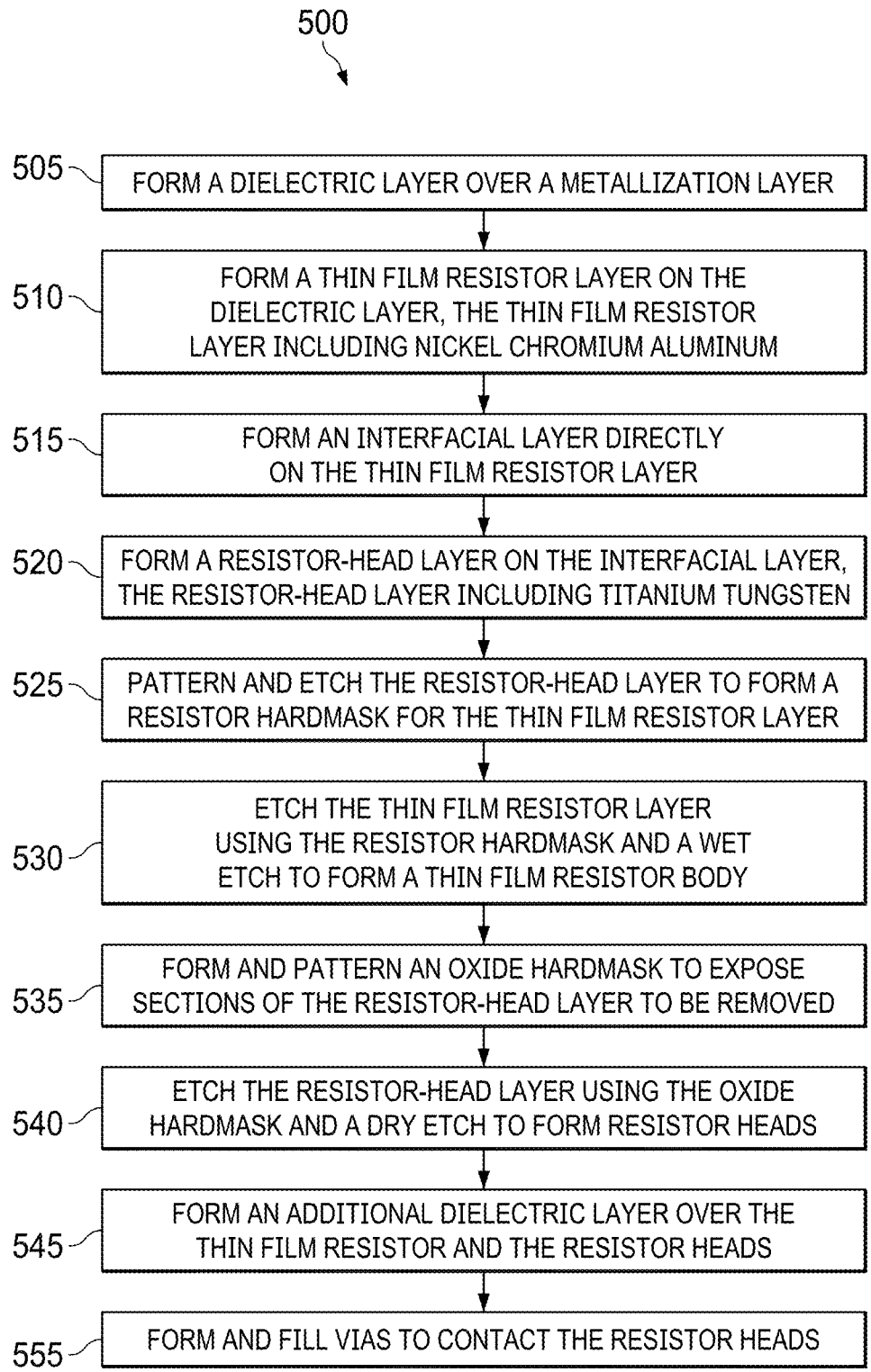
FIG. 5 depicts a flowchart of a method of fabricating a thin film resistor according to an implementation of the disclosure.

FIG. 5 depicts a method 500 of forming an integrated circuit (e.g., 200, FIG. 2) that includes a thin film resistor structure according to an implementation of the disclosure. The method begins with forming a dielectric layer over a metallization layer (505). The metallization layer may be any of the metallization layers (e.g., second metal segments 220 in FIG. 2) formed as part of an integrated circuit. Where laser trimming of the thin film resistor (e.g., thin film resistor body 104 in FIG. 1F or thin film resistor body 226 in FIG. 2) may be desirable, the metallization layer may be at the top of the metallization stack, but may otherwise be located at any level as desired. The dielectric layer may be, e.g., the first dielectric sublayer 218A (FIG. 2). Forming the dielectric layer may include forming a trench (e.g., trench 222, FIG. 2) in the dielectric layer to allow for fabrication of the thin film resistor structure (e.g., 224, FIG. 2).

The method continues with forming a thin film layer (e.g., 103, FIG. 1A) on the dielectric layer (510) (e.g., 102, FIG. 1A or the first dielectric sublayer 218A, FIG. 2). The thin film layer may include nickel chromium aluminum. The NiCrAl may be sputtered using an Endura Sputter System that includes a chamber for NiCrAl.

The method continues with forming an interfacial layer (e.g., 106, FIG. 1A) directly on the thin film layer (515) (e.g., 103, FIG. 1A). Using the Endura Sputter System, a wafer may be transferred to a chamber capable of sputtering the interfacial layer without a break in vacuum. In one implementation, the interfacial layer is titanium, which may be sputtered using a titanium target and an argon plasma. In one implementation, the interfacial layer is titanium nitride, which may be sputtered using a titanium target with an argon and nitrogen containing plasma. Sputtering of the titanium nitride interfacial layer may use argon that is delivered at a rate between about 30 sccm and about 45 sccm, and may be, e.g., 45 sccm, and may also use nitrogen that is delivered at a rate between about 45 sccm and about 100 sccm, e.g., 95 sccm. In the context of flow rate, the term "about" means±10%. The sputter process for the TiN interfacial layer lasts between about 2 seconds and about 10 seconds and may be, e.g., 4 seconds at a DC power that is between about 400 W and about 1000 W, e.g., 700 W and process pressure of about 6 mTorr. In one implementation, the interfacial layer may have a thickness that is between about 3 Å and about 20 Å, e.g., 7 Å. In one implementation, the interfacial layer may have a thickness that is between about 20 Å and about 100 Å.

An alternate method of forming the interfacial layer may include applying an $N_2$-containing plasma step to the NiCrAl surface. Although the present inventors were unable to test the use of an $N_2$-containing plasma step prior to deposition of the resistor-head layer, it is anticipated that this method would also improve interface adhesion between the thin film layer (e.g., 103, FIG. 1B) and the resistor-head layer (e.g., 107, FIG. 1B) and would increase the resistance to accelerated chemical attack of the interface between these two layers. Each of aluminum, nickel, and chromium has been known to react with nitrogen to form nitrides, e.g., AlN, CrN, and $NiN_3$. When TiN was used as the interfacial layer, the effect was greater than expected for the short processing time. It is believed that by using an $N_2$-containing plasma, the surface of the NiCrAl may be nitrided, forming an interfacial layer that may provide the desired properties of increased bonding between the NiCrAl and the titanium tungsten.

The method may continue with forming a resistor-head layer (520) (e.g., resistor-head layer 107, FIG. 1A) on the interfacial layer (e.g., 106, FIG. 1A). The resistor-head layer may include titanium tungsten, which may be deposited using chemical vapor deposition (CVD) or by sputtering using a TiW target. Prior to being etched into a final shape, the resistor-head layer is first used as a resistor hardmask during an etch process of the thin film layer (e.g., 103, FIG. 1A). This may be accomplished by depositing and patterning a photoresist layer (e.g., 110, FIG. 1A) that exposes portions of the resistor-head layer that are outside the thin film resistor area. This patterned photoresist layer is then used to pattern and etch the resistor-head layer to serve as a resistor hardmask for etching the thin film layer (525). The resistor-head layer may be etched using a dry etch.

Once the resistor-head layer (e.g., 107, FIG. 1B) is shaped to form a resistor hardmask, the method may continue by etching the thin film layer (e.g., 103, FIG. 1B) using the resistor-head layer as a resistor hardmask and also using a wet etch to form a thin film resistor body (530) (e.g., 104, FIG. 1C). The addition of the interfacial layer (e.g., 106, FIG. 1A) between the thin film layer (e.g., 103, FIG. 1A) and the resistor-head layer (107, FIG. 1B) that is being used as resistor hardmask may provide smoother edges to the thin film resistor (e.g., 104, FIG. 1F or 226, FIG. 2) and greater bonding between the thin film layer and the resistor-head layer. In one implementation, the wet etch uses an aqueous solution of 6% perchloric acid and 9% ceric ammonium nitrate by weight, which is available commercially as an etching solution CR7 from Cyantek Corporation. The etching time may be about 26 seconds to about 30 seconds at 25° C. In the context of time, the term "about" means±5%. In an implementation in which the interfacial layer contains TiN, the thin film resistor may have a TCR that is less than about 15 ppm/° C.

The method now continues to further shape the resistor-head layer (e.g., 107, FIG. 1D) to form resistor heads (108, FIG. 1E). A resistor-head hardmask (e.g., 116, FIG. 1E) is deposited and patterned using a photoresist (e.g., 118, FIG. 1E) to protect regions for the resistor heads (535). The resistor-head layer is then etched using the resistor-head hardmask and a dry etch to form resistor heads (540) at each end of the thin film resistor. Once the resistor heads are completed, the resistor-head hardmask may be removed, but may also remain in place.

An additional dielectric layer (e.g., 218B, FIG. 2) may be deposited over the thin film resistor body (226, FIG. 2) and the resistor heads (228, FIG. 2). Finally, the method etches vias through the additional dielectric layer to contact the resistor heads (550) (e.g., 228, FIG. 2). At the same time, vias may be formed to contact other segments of the current metallization layer (e.g., 220, FIG. 2).

Applicants have disclosed a thin film resistor structure having a thin film resistor body formed of NiCrAl and resistor heads formed of TiW. A new, thin interfacial layer is placed between the NiCrAl and the TiW to provide a stronger bond between the thin film resistor body and the resistor heads. The new interfacial layer may comprise titanium, titanium nitride, a combination of these layers, or be the result of applying an $N_2$-containing plasma step to the thin film resistor body surface. The new interfacial layer may not only improve the undercut produced by a wet etch of the NiCrAl, but may also provide one or more of decreased line-edge roughness, a higher degree of uniformity across the wafer, a higher degree of uniformity across wafers, and a temperature coefficient of resistance that is less than 15 ppm/° C.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. An integrated circuit comprising:
    a thin film resistor body that includes nickel chromium aluminum (NiCrAl) over a dielectric layer, wherein the thin film resistor body has a first thickness;
    an interfacial layer on the thin film resistor body, wherein the interfacial layer has a second thickness less than the first thickness; and
    resistor heads on the interfacial layer, the resistor heads including titanium tungsten (TiW).

2. The integrated circuit as recited in claim 1 wherein the interfacial layer includes titanium (Ti).

3. The integrated circuit as recited in claim 1 wherein the interfacial layer includes titanium nitride (TiN).

4. The integrated circuit as recited in claim 1 wherein the interfacial layer includes a titanium nitride layer and a titanium layer.

5. The integrated circuit as recited in claim 1 wherein the interfacial layer includes a nitrided surface of the NiCrAl.

6. The integrated circuit as recited in claim 1 wherein the interfacial layer has a thickness in a range of about 3-100 Å.

7. The integrated circuit as recited in claim 1 wherein the thin film resistor body is over an inter-level dielectric.

8. The integrated circuit as recited in claim 1 wherein the thin film resistor body has a temperature coefficient of about 15 ppm/° C. or less.

9. A method of fabricating an integrated circuit with a thin film resistor comprising:
    forming a thin film layer on a dielectric layer, the thin film layer including nickel chromium aluminum, wherein the thin film layer has a first thickness;
    forming an interfacial layer directly on the thin film layer, wherein the interfacial layer has a second thickness less than the first thickness;
    forming a resistor-head layer on the interfacial layer, the resistor-head layer including titanium tungsten;
    patterning and etching the resistor-head layer to form a resistor hardmask for the thin film layer; and
    etching the thin film layer using the resistor hardmask and a wet etch to form a thin film resistor body.

10. The method as recited in claim 9 wherein forming the interfacial layer includes forming a titanium layer on the thin film layer.

11. The method as recited in claim 9 wherein forming the interfacial layer includes forming a titanium nitride layer on the thin film layer.

12. The method as recited in claim 9 wherein forming the interfacial layer includes applying a nitrogen-containing plasma step to a surface of the thin film layer.

13. The method as recited in claim 9 including:
    depositing and patterning a resistor-head hardmask over the resistor-head layer; and
    using the resistor-head hardmask and a dry etch process to etch the resistor-head layer and form resistor heads at ends of the thin film resistor.

14. The method as recited in claim 9 wherein etching the thin film layer uses an aqueous solution of perchloric acid and ceric ammonium nitrate.

15. The method as recited in claim 9 wherein the dielectric layer is an inter-level dielectric.

16. The method as recited in claim 13 including:
    forming an additional dielectric layer over the thin film resistor and the resistor heads; and
    forming and filling vias through the additional dielectric layer to contact the resistor heads.

17. A thin film resistor structure comprising:
    a thin film resistor body including nickel chromium aluminum (NiCrAl) formed over an oxide layer, the thin film resistor body having a first thickness;
    a titanium nitride (TiN) layer formed over the thin film resistor body, the TiN layer having a second thickness less than the first thickness; and
    resistor heads including titanium tungsten (TiW) formed on the TiN layer.

18. The thin film resistor structure as recited in claim 17 in which the thin film resistor structure has a temperature coefficient of about 15 ppm/° C. or less.

19. The thin film resistor structure as recited in claim 17 in which the TiN layer is formed directly on the thin film resistor body.

20. The thin film resistor structure as recited in claim 19 including a titanium (Ti) layer formed directly on the TiN layer, the TiW of the resistor heads being formed directly on the Ti layer.

21. The thin film resistor structure as recited in claim 17 including a titanium (Ti) layer formed directly on the thin film resistor body, the TiN layer formed directly on the Ti layer.

22. A thin film resistor structure, comprising:
a thin film resistor body including nickel chromium aluminum (NiCrAl) formed over an oxide layer, the thin film resistor body having a thickness less than or equal to about 0.1 µm;
a titanium nitride (TiN) layer formed directly on the thin film resistor body;
a titanium (Ti) layer formed directly on the TiN layer; and
resistor heads including titanium tungsten (TiW) formed directly on the Ti layer.

23. An integrated circuit, comprising:
a thin film resistor body that includes nickel chromium aluminum (NiCrAl) over a dielectric layer;
an interfacial layer on the thin film resistor body; and
resistor heads on the interfacial layer, the resistor heads including titanium tungsten (TiW).

24. The integrated circuit as recited in claim 23, wherein the interfacial layer includes titanium (Ti).

25. The integrated circuit as recited in claim 23, wherein the interfacial layer includes titanium nitride (TiN).

26. The integrated circuit as recited in claim 23, wherein the interfacial layer includes a titanium nitride layer and a titanium layer.

27. The integrated circuit as recited in claim 23, wherein the interfacial layer includes a nitrided surface of the NiCrAl.

28. The integrated circuit as recited in claim 23, wherein the interfacial layer has a thickness in a range of about 3-100 Å.

29. The integrated circuit as recited in claim 23, wherein the thin film resistor body is over an inter-level dielectric.

30. The integrated circuit as recited in claim 23, wherein the thin film resistor body has a temperature coefficient of about 15 ppm/° C. or less.

31. A thin film resistor structure, comprising:
a thin film resistor body including nickel chromium aluminum (NiCrAl) formed over an oxide layer, the thin film resistor body having a thickness less than or equal to about 0.1 um;
a titanium nitride (TiN) layer formed over the thin film resistor body; and
resistor heads including titanium tungsten (TiW) formed on the TiN layer.

32. The thin film resistor structure as recited in claim 31 in which the thin film resistor structure has a temperature coefficient of about 15 ppm/° C. or less.

33. The thin film resistor structure as recited in claim 31 in which the TiN layer is formed directly on the thin film resistor body.

34. The thin film resistor structure as recited in claim 33, further comprising a titanium (Ti) layer formed directly on the TiN layer, the TiW of the resistor heads being formed directly on the Ti layer.

35. The thin film resistor structure as recited in claim 31, further comprising a titanium (Ti) layer formed directly on the thin film resistor body, the TiN layer formed directly on the Ti layer.

* * * * *